United States Patent
Bang et al.

(10) Patent No.: US 8,710,650 B2
(45) Date of Patent: Apr. 29, 2014

(54) SEMICONDUCTOR DEVICES HAVING THROUGH ELECTRODES AND METHODS OF FABRICATING THE SAME

(71) Applicant: Samsung Electronics Co., Ltd., Suwon-si (KR)

(72) Inventors: Sukchul Bang, Yongin-si (KR); Kwangjin Moon, Hwaseong-si (KR); Byung Lyul Park, Seoul (KR); Dosun Lee, Gwangju (KR); Deok-Young Jung, Seoul (KR); Gilheyun Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/047,548

(22) Filed: Oct. 7, 2013

(65) Prior Publication Data
US 2014/0035144 A1   Feb. 6, 2014

Related U.S. Application Data

(63) Continuation of application No. 13/597,352, filed on Aug. 29, 2012, now Pat. No. 8,551,860.

(30) Foreign Application Priority Data

Aug. 30, 2011   (KR) ........................ 10-2011-0086935

(51) Int. Cl.
 *H01L 23/34*   (2006.01)
(52) U.S. Cl.
 USPC ........... 257/717; 257/510; 257/557; 257/774; 257/778
(58) Field of Classification Search
None
See application file for complete search history.

(56) References Cited

U.S. PATENT DOCUMENTS

| | | | |
|---|---|---|---|
| 7,432,196 B2 | 10/2008 | Tanida et al. | |
| 8,035,198 B2 * | 10/2011 | Ding et al. | 257/621 |
| 2008/0099870 A1 | 5/2008 | Wilson et al. | |
| 2010/0176494 A1 | 7/2010 | Chen | |

FOREIGN PATENT DOCUMENTS

| | | |
|---|---|---|
| JP | 2004-342861 | 12/2004 |
| JP | 4365750 B2 | 3/2006 |
| JP | 2010-166052 | 7/2010 |
| JP | 2010-205990 | 9/2010 |
| KR | 1020060053177 A | 5/2006 |
| KR | 1020100083718 A | 7/2010 |

* cited by examiner

*Primary Examiner* — Kyoung Lee
(74) *Attorney, Agent, or Firm* — Myers Bigel Sibley & Sajovec, P.A.

(57) ABSTRACT

Provided are semiconductor devices having through electrodes and methods of fabricating the same. The method includes providing a substrate including top and bottom surfaces facing each other, forming a hole and a gap extending from the top surface of the substrate toward the bottom surface of the substrate, the gap surrounding the hole and being shallower than the hole, filling the hole with an insulating material, forming a metal interconnection line on the top surface of the substrate on the insulating material, recessing the bottom surface of the substrate to expose the insulating material, removing the insulating material to expose the metal interconnection line via the hole, filling the hole with a conductive material to form a through electrode connected to the metal interconnection line, recessing the bottom surface of the substrate again to expose the gap, and forming a lower insulating layer on the bottom surface of the substrate.

11 Claims, 23 Drawing Sheets

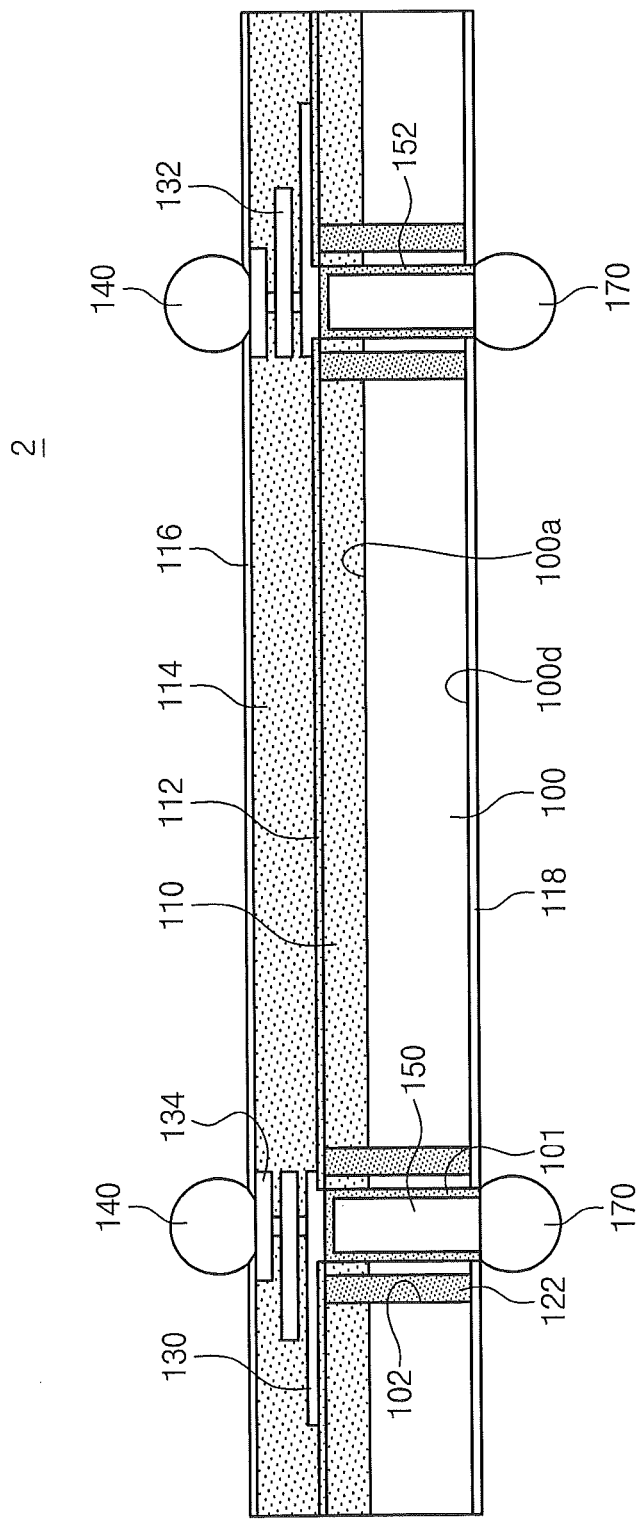

SEMICONDUCTOR DEVICES HAVING THROUGH ELECTRODES AND METHODS OF FABRICATING THE SAME

CROSS-REFERENCE TO RELATED APPLICATIONS

This application is a continuation of and claims priority to U.S. application Ser. No. 13/597,352, filed Aug. 29, 2012 (now U.S. Pat. No. 8,551,860), which claims priority under 35 U.S.C. §119 to Korean Patent Application No. 10-2011-0086935, filed Aug. 30, 2011, the disclosures of which are hereby incorporated herein by reference.

FIELD

Embodiments of the inventive concepts relate generally to a semiconductor device, and more particularly, to semiconductor devices having through electrodes and to methods of fabricating the same.

BACKGROUND

In the semiconductor industry, it has been suggested to use a through electrode or a through silicon via (TSV) technology for replacing a wire bonding technology. In through electrode technology, an electrode is formed to penetrate a semiconductor substrate. Through electrode techniques can generally be classified as via-last schemes or via-middle schemes. In via-last schemes, a through electrode is formed after forming integrated circuits and metal interconnection lines. In via-middle schemes, a through electrode is formed after forming the integrated circuits but before forming the metal interconnection lines.

Metal interconnection lines may be formed under relatively high temperature conditions. In a via-middle scheme, when this is done after the formation of the through electrode, the resulting thermal stress may lead to an upward expansion or extrusion of the through electrode. This extrusion of the through electrode may undesirably result in a delamination of metal interconnection lines that are in contact with the through electrode or an increase in interfacial resistance between the through electrode and the metal interconnection line.

In order to overcome these technical issues, a through electrode forming process has been described which includes filling a through electrode hole with an insulating material, forming a metal interconnection line thereon, removing the insulating material from the through electrode hole, and then filling the through electrode hole with a metal layer, as disclosed in Japanese Patent Publication Number 2004-342861. As shown in FIG. 6 of Japanese Patent Publication Number 2004-342861, when the insulating material is removed from the through electrode hole, a portion of the insulating material should be allowed to remain on a sidewall of the through electrode hole in order to electrically isolate the through electrode from the substrate. However, this may lead to additional technical difficulties, such as misalignment of an etch-mask to be additionally formed and/or increasing difficulty in an etching process.

SUMMARY

Embodiments of the inventive concepts provide a semiconductor device and a method of fabricating the same that may reduce or avoid contact failures between a through electrode and a metal interconnection line.

Other embodiments of the inventive concepts provide a semiconductor device and a method of fabricating the same that provide a through electrode that is isolated from a substrate.

Still other embodiments of the inventive concepts provide a semiconductor device and a method of fabricating the same that can protect a through electrode from high temperature processing that can damage and/or deform the through electrode.

According to example embodiments of the inventive concepts, a method of fabricating a semiconductor device may include providing a substrate including top and bottom surfaces facing each other, forming a hole and a gap extending from the top surface of the substrate toward the bottom surface of the substrate, the gap surrounding the hole and being shallower than the hole, filling the hole with an insulating material, forming a metal interconnection line on the top surface of the substrate over the insulating material, recessing the bottom surface of the substrate to expose the insulating material, removing the insulating material to expose the metal interconnection line via the hole, filling the hole with a conductive material to form a through electrode connected to the metal interconnection line, recessing the bottom surface of the substrate again to expose the gap, and forming a lower insulating layer on the bottom surface of the substrate.

In some embodiments, the hole has a first width and the gap has a second width smaller than the first width.

In some embodiments, the gap may be formed to have a ring shape surrounding the hole.

In some embodiments, recessing the substrate includes partially removing the bottom surface of the substrate using at least one of an etching, chemical-mechanical polishing, grinding, or any combination thereof to make the substrate thin.

In some embodiments, the removing of the insulating material includes dry or wet etching the insulating material, in a self-alignment manner, using an etchant capable of selectively removing the insulating material.

In some embodiments, the method may further include forming a metal layer to cover an inner wall of the hole and be in contact with the metal interconnection line, before the forming of the through electrode.

In some embodiments, the exposing of the gap includes removing a portion of the substrate interposed between bottom surfaces of the substrate and the gap to isolate a portion of the substrate interposed between the through electrode and the gap from the remaining portion of the substrate.

In some embodiments, the providing of the substrate may include forming an integrated circuit on the top surface of the substrate, and forming a first interlayer dielectric on the top surface of the substrate to cover the integrated circuit.

In some embodiments, the gap may be formed to include an internal space, whose top and bottom entrances may be sealed by the first interlayer dielectric and the lower insulating layer, and the internal space may be in the state of a vacuum or may be filled with an air.

In some embodiments, the metal interconnection line may be formed on the first interlayer dielectric, and the method further includes forming a second interlayer dielectric on the first interlayer dielectric to cover the metal interconnection line, after forming the metal interconnection line.

According to example embodiments of the inventive concepts, a semiconductor device may include a substrate having a top surface provided with an integrated circuit and a bottom surface facing the first surface, a through electrode penetrating the substrate to be electrically connected to the integrated circuit, an air gap spaced apart from the through electrode to surround the through electrode, and a metal interconnection line provided on the top surface of the substrate and coupled to the through electrode. The substrate may include an isolated portion interposed between the air gap and the through electrode, and the isolated portion may be spatially and electrically spaced apart from the remaining portion of the substrate by the air gap. The through electrode may be in direct contact with the isolated portion of the substrate.

In some embodiments, the through electrode includes at least one of a conductive layer or a barrier metal layer, and the conductive layer may be formed to fill a hole penetrating the substrate and the barrier metal layer may be provided between the conductive layer and the metal interconnection line and between the conductive layer and the isolated portion.

In some embodiments, the through electrode may include copper and the barrier metal layer may include titanium nitride or tantalum nitride preventing the copper from being diffused.

In some embodiments, the device may further include an insulating layer filling the air gap.

In some embodiments, the air gap may be shaped like a ring surrounding the through electrode, in plan view.

Methods of fabricating a semiconductor device according to further embodiments include forming a hole through a substrate, filling the hole with a conductive material to form a conductive through electrode in the hole, and forming an isolating gap surrounding the hole, wherein the isolating gap extends completely through the substrate and a portion of the substrate is between the isolating gap and the conductive through electrode and wherein the conductive through electrode and the portion of the substrate are isolated from remaining portions of the substrate by the isolating gap. The isolating gap may be at least partially filled with an insulating material. A conductive barrier layer may be formed in the hole before filling the hole with the conductive material.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 1D is a sectional view of a semiconductor device according to other example embodiments of the inventive concepts;

Figure 1A:
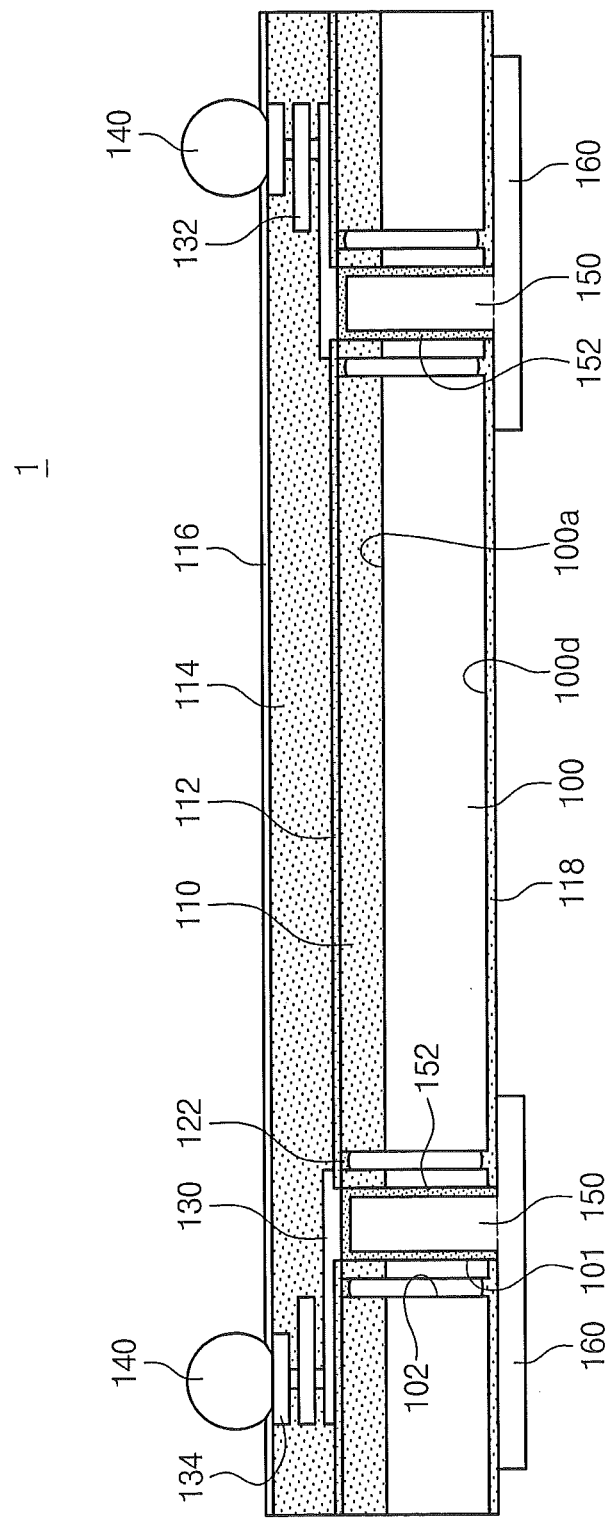
FIG. 1A is a sectional view of a semiconductor device according to example embodiments of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Structure

Example 1

Figure 1B:
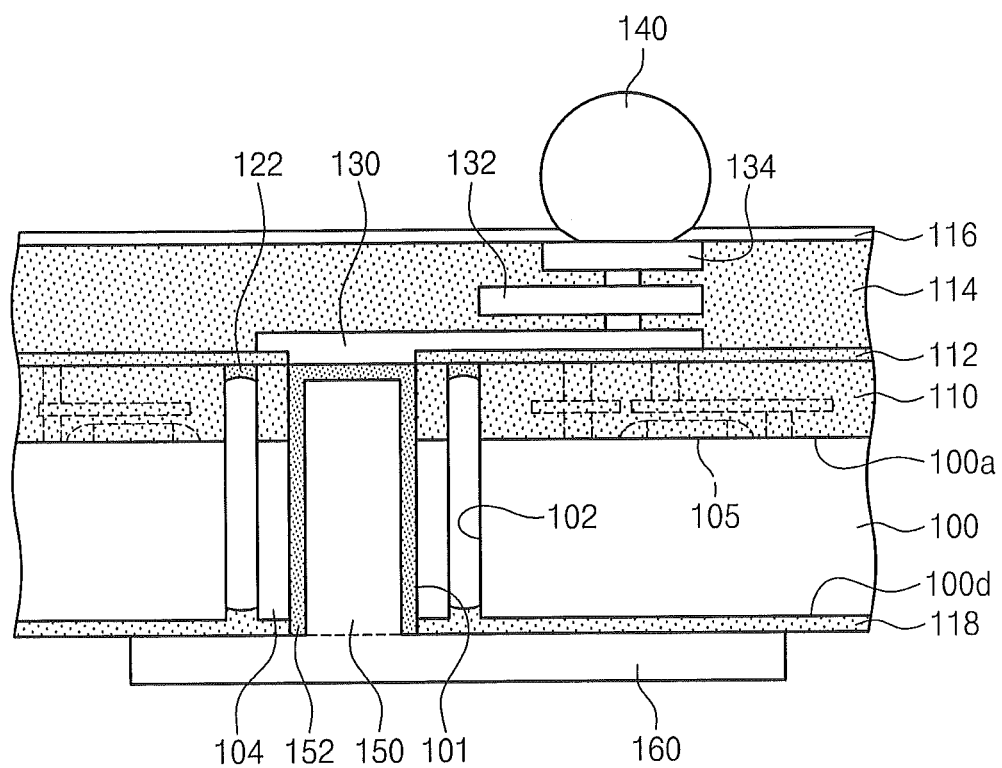
FIG. 1B is an enlarged sectional view illustrating a portion of the semiconductor device of FIG. 1A.
Figure 1C:
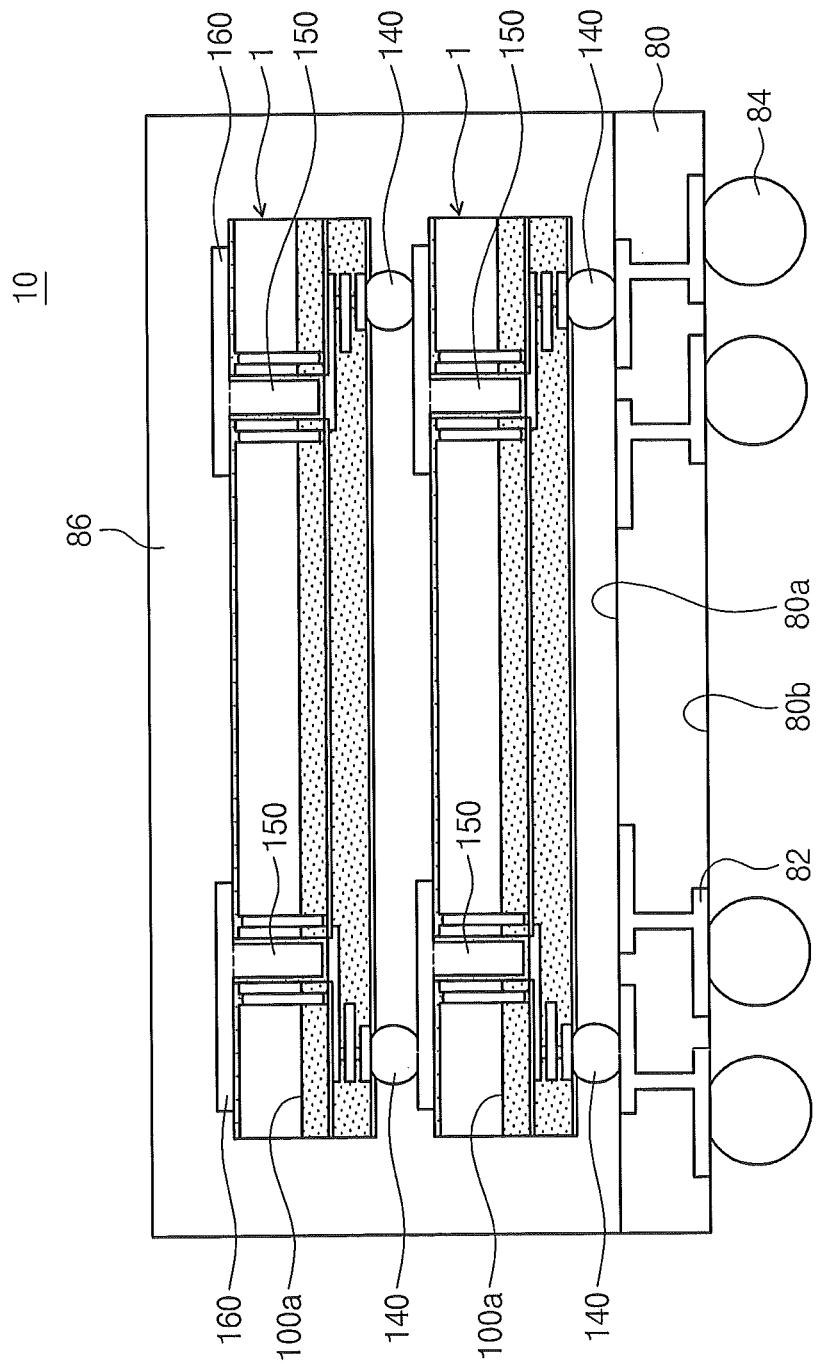
FIG. 1C is a sectional view of a semiconductor package including the semiconductor device of FIG. 1A.

FIG. 1A is a sectional view of a semiconductor device according to example embodiments of the inventive concepts. FIG. 1B is an enlarged sectional view illustrating a portion of the semiconductor device of FIG. 1A, and FIG. 1C is a sectional view of a semiconductor package including the semiconductor device of FIG. 1A.

Referring to FIG. 1A, a semiconductor device 1 may include a substrate 100 and a through electrode 150. The substrate 100 may include a top surface 100a (hereinafter, referred to as "active surface") provided with an integrated circuit 105 and a bottom surface 100d (hereinafter, referred to as "inactive surface") facing the top surface 100a. The through electrode 150 may be formed to penetrate the substrate 100 and be used to deliver electric signals to the integrated circuit 105. The substrate 100 may be provided as a chip level substrate or a wafer level substrate. The integrated circuit 105 may be configured to include at least one of a memory circuit, a logic circuit, or a combination thereof. An upper metal interconnection line 130 may be provided on the active surface 100a of the substrate 100 to electrically connect the through electrode 150 with the integrated circuit 105. The upper metal interconnection line 130 may be electrically connected to a bonding pad 134, and a solder ball 140 may be attached on the bonding pad 134 to provide a pathway to an exterior.

A second metal interconnection line 132 may be further provided between the upper metal interconnection line 130 and the bonding pad 134. The second metal interconnection line 132 may be electrically connected to the integrated circuit 105 or the substrate 100. A first interlayer dielectric 110 may be provided on the active surface 100a of the substrate 100 to cover the integrated circuit 105. A second interlayer dielectric 114 may be provided on the first interlayer dielectric 110 to cover the metal interconnection line 130, the second metal interconnection line 132, and the bonding pad 134. The second interlayer dielectric 114 may be covered with an upper insulating layer 116, and the inactive surface 100d of the substrate 100 may be covered with a lower insulating layer 118. An etch stop layer 112 may be further provided between the first interlayer dielectric 110 and the second interlayer dielectric 114.

A lower metal interconnection line 160 may be further provided on the lower insulating layer 118 and be connected to a bottom portion of the through electrode 150. In other embodiments, a solder ball (not shown) may be further attached to the lower metal interconnection line 160. In still other embodiments, the solder ball (not shown) may be directly attached to the bottom portion of the through electrode without the lower metal interconnection line 160.

Referring to FIG. 1B, the through electrode 150 may penetrate the substrate 100 and the first interlayer dielectric 110, and both end portions thereof may be connected to the upper metal interconnection line 130 and the lower metal interconnection line 160. Accordingly, the through electrode 150 can be used as a pathway for delivering electric signals between the upper and lower metal interconnection lines 130 and 160 along a normal direction to the top surface of the substrate 100. A metal liner layer 152 may be further included to cover side and top surfaces of the through electrode 150 may be covered with a metal liner layer 152 so that the metal liner layer 152 may be in direct contact with a portion 104 of the substrate 100. The through electrode 150 may be directly or indirectly contacted to the portion 104 of the substrate 100. For all that, according to the present embodiments, the portion 104 of the substrate 100 may be spaced and isolated from the remaining portion of the substrate 100, and thus, the through electrode 150 may be electrically isolated from the substrate 100. Furthermore, a gap 102 may be provided to surround a sidewall of the through electrode 150, and in this case, it is possible to more effectively improve an electric isolation between the through electrode 150 and the substrate 100. The gap 102 may be formed to vertically penetrate the first interlayer dielectric 110 and the substrate 100. In some embodiments, the gap 102 may be in the state of a vacuum or be filled with a medium (e.g., air) whose dielectric constant is substantially close to one. In some embodiments, the gap 102 may be partially filled with a gap-fill insulating layer 122 and/or the lower insulating layer 118.

The through electrode 150 may be formed of a metallic material filling a hole 101, which is formed to penetrate the substrate 100 and the first interlayer dielectric 110. In some embodiments, the hole 101 may be formed based on a via-middle scheme, which is configured to form the hole 101 after the formation of the integrated circuit 105 and before the formation of the metal interconnection lines 130 and 132. The through electrode 150 may be formed based on a via-last scheme, which is configured to form the through electrode 150 after the formation of the metal interconnection lines 130 and 132. As a result, the through electrode 150 can be unaffected by a process of forming the metal interconnection lines 130 and 132. For example, the through electrode 150 may not be expanded or extruded over the first interlayer dielectric 110 by a thermal stress accompanying the formation of the metal interconnection lines 130 and 132. This may enable the realization of a semiconductor device 1, in which a contact failure between the through electrode 150 and the upper metal interconnection line 130 and/or an increase in interfacial resistance can be reduced or prevented from occurring by the extrusion of the through electrode 150. This will be described in more detail with reference to the following description of a fabrication method thereof.

Referring to FIG. 1C, a semiconductor package 10 may include a package substrate 80 and at least one semiconductor device mounted thereon. The semiconductor device may be the semiconductor device 1 described with reference to FIG. 1A. The semiconductor package 10 may further include a molding layer 86 encapsulating the at least one semiconductor device 1. The package substrate 80 may include a top surface 80a and a bottom surface 80b facing each other. In some embodiments, the package substrate 80 may be a printed circuit board (PCB), in which an internal wire 82 is provided. The semiconductor device 1 may be mounted on the top surface 80a of the package substrate 80 in a face-down manner; that is, the semiconductor device 1 may be mounted in such a way that the active surface 100a thereof faces the package substrate 80. In this case, the through electrode 150 may be electrically connected to the internal wire 82 of the package substrate 80 via the solder ball 140. In the case in which a plurality of the semiconductor devices 1 are mounted on the package substrate 80, the semiconductor devices 1 may be electrically connected with each other via the through electrodes 150 as well as the solder ball 140 and the lower metal interconnection line 160 interposed between the through electrodes 150. The semiconductor package 10 may further include a solder ball 84, which may be attached on the bottom surface 80b of the package substrate 80 and connected to the internal wire 82. According to the present embodiments, due to the presence of the through electrodes 150, it is possible to realize an electric connection between the semiconductor devices 1 and between the semiconductor devices 1 and the package substrate 80.

Structure

Example 2

Figure 1E:
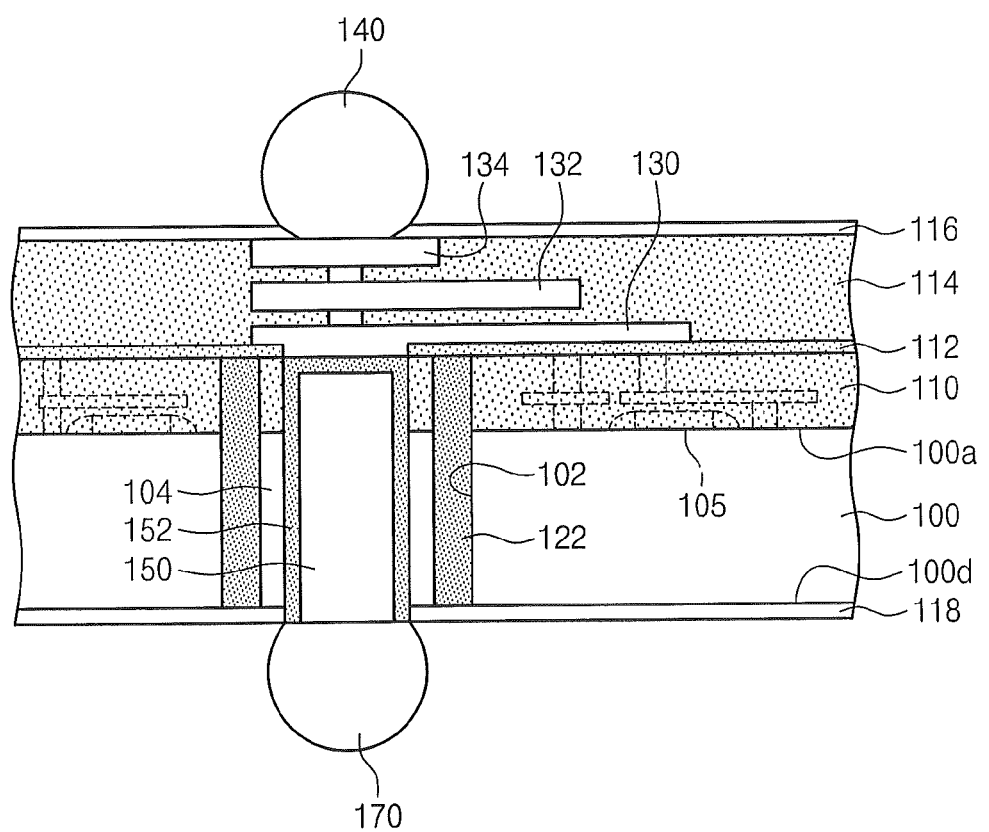
FIG. 1E is an enlarged sectional view illustrating a portion of the semiconductor device of FIG. 1D.
Figure 1F:
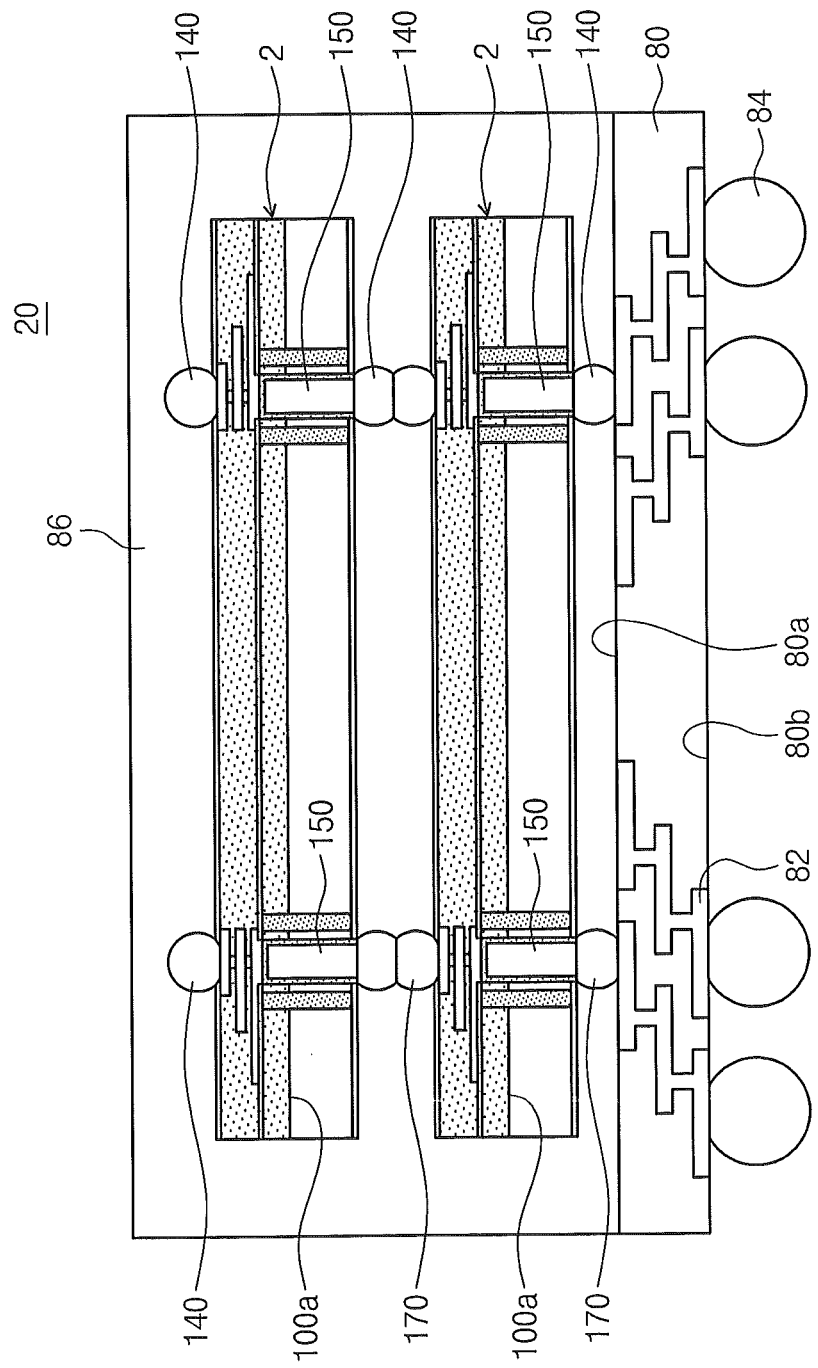
FIG. 1F is a sectional view of a semiconductor package including the semiconductor device of FIG. 1D.

FIG. 1D is a sectional view of a semiconductor device according to other example embodiments of the inventive concepts. FIG. 1E is an enlarged sectional view illustrating a portion of the semiconductor device of FIG. 1D, and FIG. 1F is a sectional view of a semiconductor package including the semiconductor device of FIG. 1D. For the sake of brevity, the elements and features of these embodiments that are similar to those previously shown and described will not be described in much further detail.

Referring to FIGS. 1D and 1E, a semiconductor device 2 may include a through electrode 150 penetrating the substrate 100 and a gap 102 spaced apart from the through electrode 150 and surrounding a sidewall of the through electrode 150. The gap 102 may be partially or wholly filled with the gap-fill insulating layer 122. The portion 104 of the substrate 100, which is isolated from the remaining portion of the substrate 100, may be interposed between the gap 102 and the through electrode 150, and the portion 104 may be in contact with the through electrode 150. A solder ball 170 may be provided on the lower insulating layer 118 and be attached to the through electrode 150. The solder ball 170 may be aligned with the solder ball 140, in plan view. In other embodiments, a metal interconnection line (not shown) may be further provided on the lower insulating layer 118 and be connected to the through electrode 150, and the solder ball 170 may be attached to the metal interconnection line.

Referring to FIG. 1F, a semiconductor package 20 may include at least one semiconductor device 2 mounted on the package substrate 80. The semiconductor device 2 may be mounted on the top surface 80a of the package substrate 80 in a face-up manner; that is, the semiconductor device 2 may be mounted in such a way that the top surface 100a thereof is oriented upward. In the case in which a plurality of the semiconductor devices 2 are stacked on the package substrate 80, the semiconductor devices 2 can be electrically connected with each other via the through electrodes 150 as well as the solder balls 140 and 170 interposed between the through electrodes 150. The semiconductor devices 2 may be electrically connected to the package substrate 80 by the through electrodes 150.

Fabricating Method

Example 1

FIGS. 2A through 2K are sectional views illustrating methods of fabricating a semiconductor device according to example embodiments of the inventive concepts.

Figure 2A:
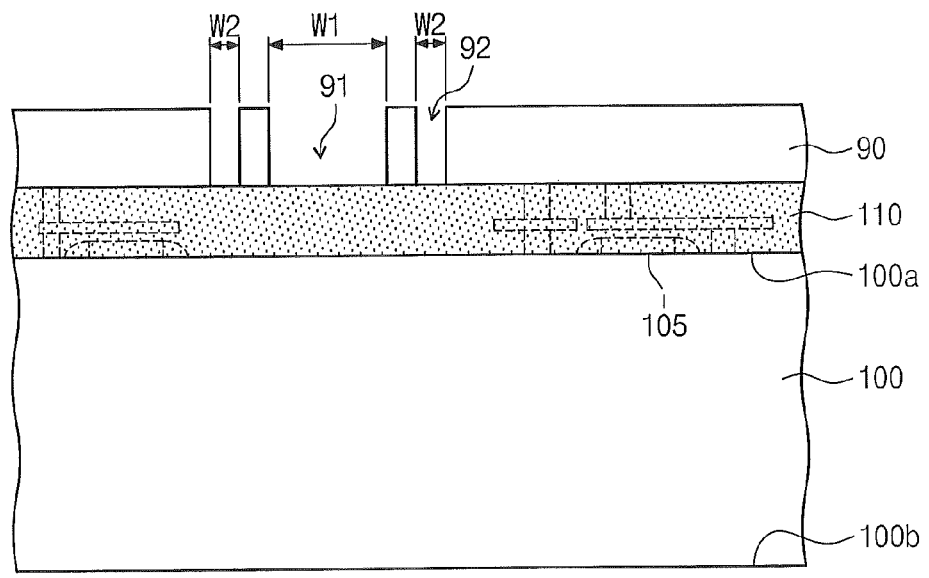
FIGS. 2A through 2K are sectional views illustrating a method of fabricating a semiconductor device according to example embodiments of the inventive concepts.

Referring to FIG. 2A, a substrate 100 may be provided. The substrate 100 may have a top surface 100a (hereinafter, referred to as "active surface") and a first bottom surface 100b facing the top surface 100a. The substrate 100 may include a semiconductor material (e.g., of silicon). An integrated circuit 105 may be formed in/on the active surface 100a of the substrate 100, and a first interlayer dielectric 110 may be formed to cover the integrated circuit 105. The integrated circuit 105 may be configured to include at least one of a memory circuit, a logic circuit, or a combination thereof.

The first interlayer dielectric 110 may be formed by depositing at least one of a silicon oxide layer (e.g., $SiO_2$), a silicon nitride layer (e.g., SiN or $Si_3N_4$), or a silicon oxynitride layer (e.g., SiON). A mask 90 may be formed on the substrate 100. In some embodiments, the mask 90 may be formed by coating and patterning a photoresist film on the first interlayer dielectric 110. The mask 90 may be formed to define a first opening 91 having a first width W1 and a second opening 92 spaced apart from the first opening 91 to have a second width W2. The first opening 91 may be formed to have a circular, elliptical, polygonal or other shape, in plan view. The second opening 92 may be shaped like a ring surrounding the first opening 91. The second width W2 may be equivalent to or different from the first width W1. In some embodiments, the second width W2 may be less than the first width W1.

Figure 2B:
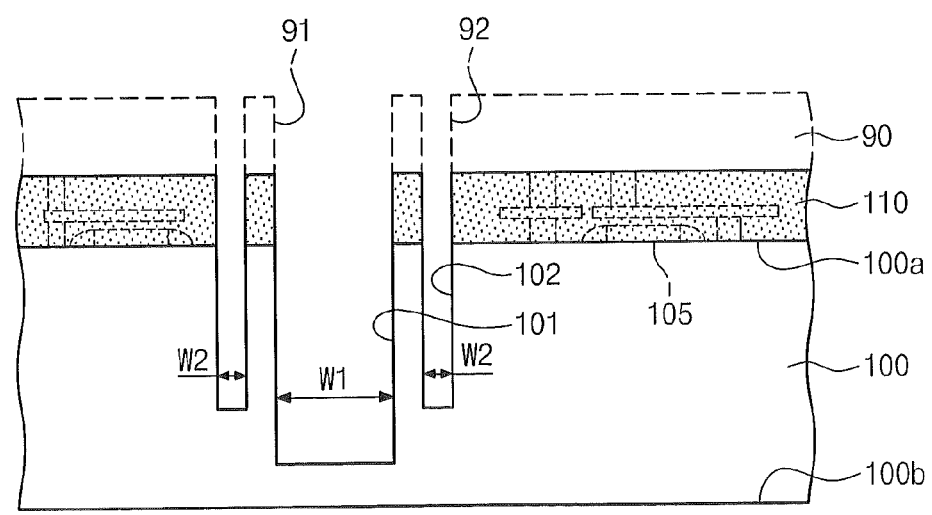

Referring to FIG. 2B, portions of the first interlayer dielectric 110 and the substrate 100 exposed by the mask 90 may be selectively removed by an etching process (e.g., a dry or wet etching) or a drilling process (e.g., a laser or mechanical drilling), etc. As a result, a hole 101 having the first width W1 may be formed below the first opening 91, and a gap 102 may be formed below the second opening 92 to surround the hole 101. In some embodiments, the hole 101 and the gap 102 may be formed simultaneously. In other embodiments, the hole 101 and the gap 102 may be formed independently by different two etching processes. For example, one of the hole 101 and the gap 102 may be formed before the other.

The hole 101 and the gap 102 may be formed in a region of the substrate 100 (e.g., a peripheral circuit region or a scribe lane), which is not provided with the integrated circuit 105. Moreover, the bottoms of the hole 101 and/or the gap 102 may be formed to be spaced apart from the first bottom surface 100b of the substrate 100 (i.e., the hole 101 and/or the gap 102 may not penetrate all the way through the substrate to the first bottom surface 100b thereof).

A pad (not shown) electrically connected to the integrated circuit 105 may be formed in a region where the hole 101 is formed, and in this case, the hole 101 may be formed to penetrate the pad. The hole 101 and the gap 102 may be formed to have different depths from each other. For example, the hole 101 may be deeper than the gap 102. Thereafter, the mask 90 may be removed using, for example, an ashing process. In order to reduce complexity in the drawings and to provide better understanding of example embodiments of the inventive concepts, the integrated circuit 105 will be omitted from the remaining ones of the drawings.

Figure 2C:
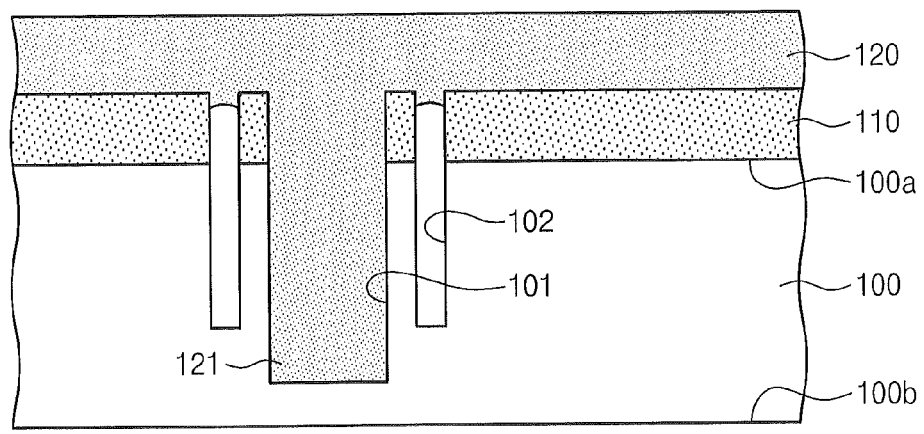

Referring to FIG. 2C, the hole 101 may be filled with a gap-fill insulating layer 120. For example, the gap-fill insulating layer 120 may be deposited on the first interlayer dielectric 110 using a chemical vapor deposition (CVD) method, and the thickness of the gap-fill insulating layer 120 may be relatively thick enough to fill the hole 101. In some embodiments, the gap-fill insulating layer 120 may be formed to incompletely or partially fill the gap 102, according to a process condition or a step coverage property of the CVD. For example, the gap-fill insulating layer 120 may include a sharp portion that is partially inserted into the gap 102. The gap-fill insulating layer 120 may be formed of a material having an etch selectivity with respect to the first interlayer dielectric 110 and the substrate 100. For example, in the case in which the substrate 100 is formed of silicon and the first interlayer dielectric 110 is formed of silicon oxide, the gap-fill insulating layer 120 may be formed of silicon nitride or polymer formed by a deposition process. Alternatively, in the case in which the first interlayer dielectric 110 is formed of silicon nitride, the gap-fill insulating layer 120 may be formed of silicon oxide or polymer.

Figure 2D:
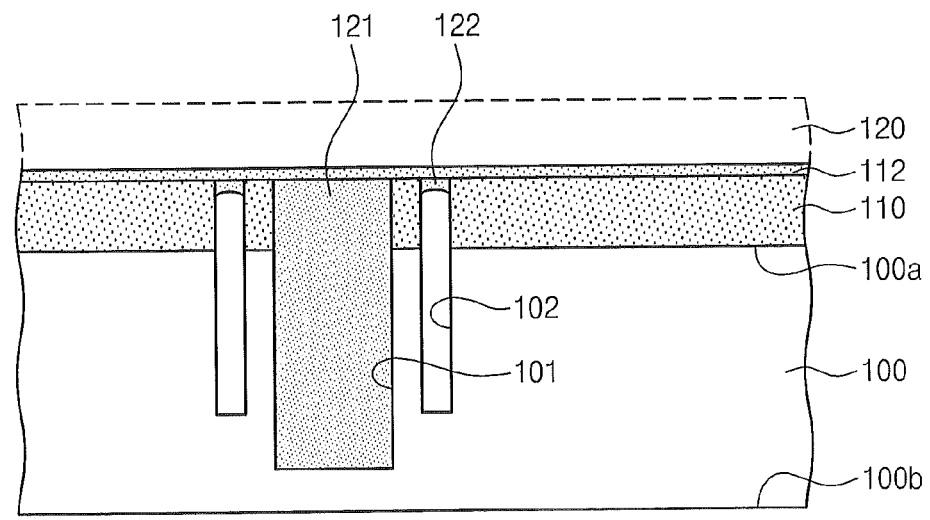

Referring to FIG. 2D, the gap-fill insulating layer 120 may be planarized using an etch-back or chemical-mechanical polishing process to expose the first interlayer dielectric 110. As the result of the planarization, the gap-fill insulating layer 120 may remain as a first gap-fill insulating layer 121 filling the hole 101 and a second gap-fill insulating layer 122 partially filling the gap 102. In some embodiments, an upper portion of the second gap-fill insulating layer 122 may be recessed by the etch-back or chemical-mechanical polishing process. In other embodiments, the gap-fill insulating layer 120 may be removed from the gap 102, such that the second gap-fill insulating layer 122 is not formed.

Optionally, an etch stop layer 112 may be further formed on the first interlayer dielectric 110 exposed by the planarization. The etch stop layer 112 may be formed of a silicon nitride layer (e.g., SiN or $Si_3N_4$) formed by a deposition process.

Figure 2E:
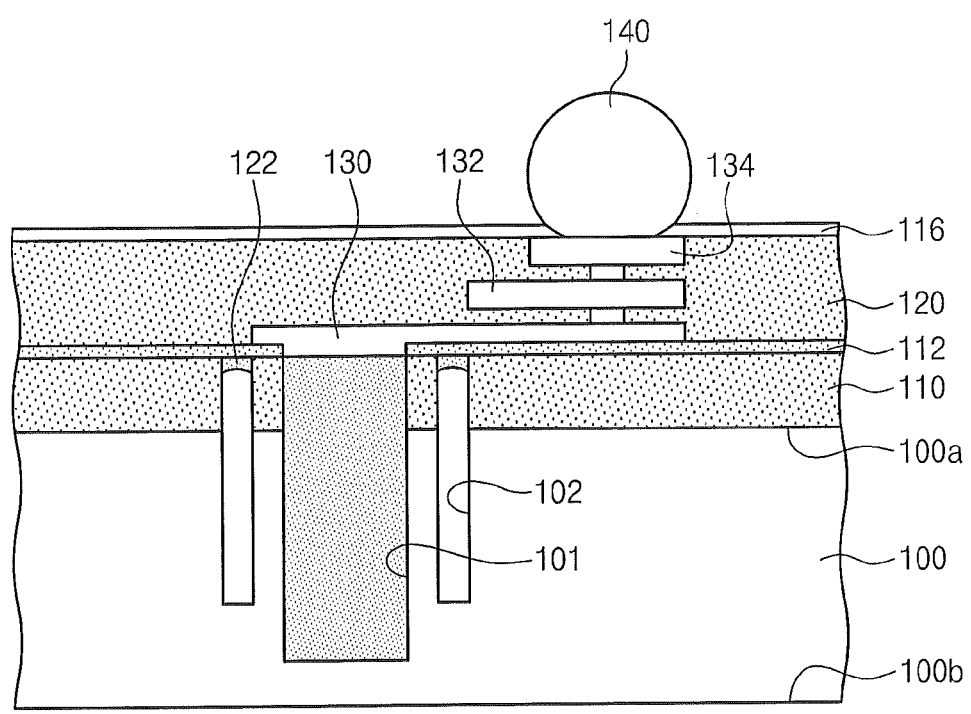

Referring to FIG. 2E, a back-end process may be performed. For example, an upper metal interconnection line 130 and a bonding pad 134 electrically connected to the upper metal interconnection line 130 may be formed on the first interlayer dielectric 110. Optionally, a second metal interconnection line 132 may be further formed between the upper metal interconnection line 130 and the bonding pad 134. The upper metal interconnection line 130 may be formed to be in direct contact with the first gap-fill insulating layer 121 filling the hole 101. For example, the formation of the upper metal interconnection line 130 may include patterning the etch stop layer 112 to expose the first gap-fill insulating layer 121, depositing a metal layer to be in direct contact with the first gap-fill insulating layer 121, and then etching the metal layer.

A second interlayer dielectric 114 may be formed on the first interlayer dielectric 110 to cover the bonding pad 134, second metal interconnection line 132 and the upper metal interconnection line 130, and an upper insulating layer 116 may be formed on the second interlayer dielectric 114. The formation of the upper insulating layer 116 may include depositing a layer, which may be, for example, formed of at least one of silicon oxide, silicon nitride, silicon oxynitride, or polymer, and then patterning the layer to expose the bonding pad 134.

Optionally, a bump forming process may be further performed to form a solder ball 140 attached to the bonding pad 134. A thermal process may be performed during the back-end process. In the conventional processes, a thermal process may result in a failure in contact between a through electrode 150 and the upper metal interconnection line 130. In more detail, if the through electrode is formed by filling the hole 101 with a metal layer, the through electrode may expand and be extruded over the first interlayer dielectric 110 during thermal process (for example, required for forming the metal interconnection lines 130 and 132). A contact failure may result from the extrusion of the through electrode. By contrast, according to the present embodiments, the extrusion of the through electrode and the contact failure of the upper metal interconnection line 130 may be effectively prevented, because the hole 101 is filled with an insulating material, whose thermal expansion coefficient is close to that of the substrate 100 compared with metals, and the through electrode may be formed after the formation of the metal interconnection lines 130 and 132, as will be described with reference to FIG. 2I.

Figure 2F:
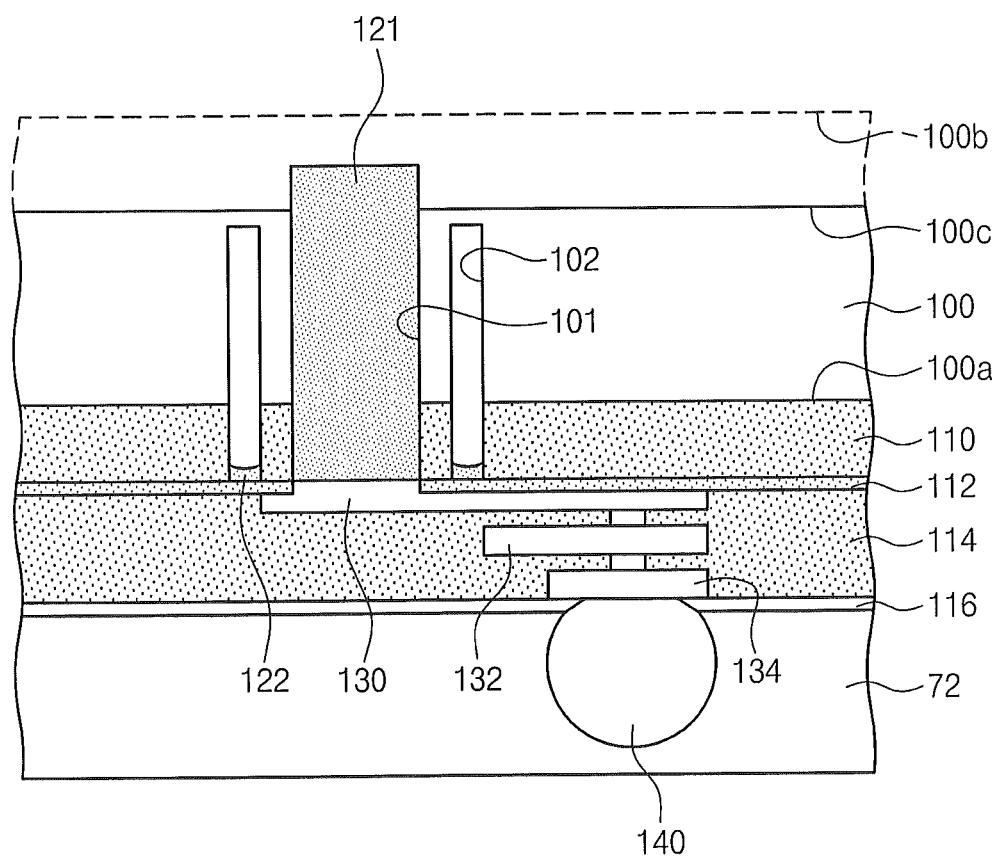

Referring to FIG. 2F, a first substrate-thinning process recessing the first bottom surface 100b of the substrate 100 may be performed to expose the first gap-fill insulating layer 121. For example, the first substrate-thinning process may be performed using at least one of an etching process, a CMP process, or a grinding process, in which an etchant or slurry capable of selectively etching the substrate 100 may be used. As a result, the first gap-fill insulating layer 121 may be exposed by a second bottom surface 100c of the substrate 100. The second bottom surface 100c may be formed not to expose the gap 102.

In some embodiments, the first substrate-thinning process may further include attaching a supporting structure 72 to the substrate 100 and inverting the substrate 100 provided with the supporting structure 72, before the recessing of the first bottom surface 100b. The supporting structure 72 may be formed of a hard material (such as, a glass substrate, a silicon substrate, a metallic substrate, or a polymer substrate) or a soft material (such as an elastic tape). The supporting structure 72 may be configured to support the substrate 100, thereby preventing the substrate 100 from being bent or damaged during the first substrate-thinning process. Furthermore, by virtue of the presence of the supporting structure 72, the metal interconnection lines 130 and 132 and/or the solder ball 140, which are formed on the substrate 100, may be substantially prevented from being damaged.

Figure 2G:
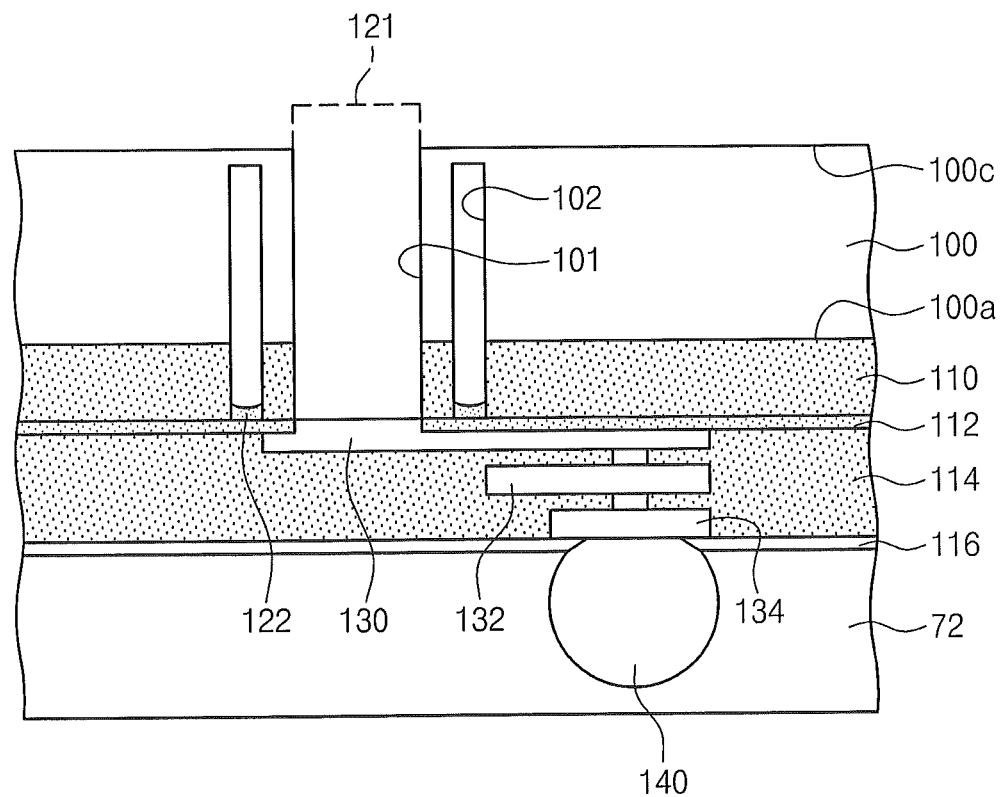

Referring to FIG. 2G, the first gap-fill insulating layer 121 may be removed by a wet or dry etching process. As the result of the removal of the first gap-fill insulating layer 121, the upper metal interconnection line 130 may be exposed through the hole 101. The hole 101 may be provided to form the through electrode 150, as shown in FIG. 2I. In the conventional processes, in order to electrically isolate the through electrode 150 from the substrate 100, it may be needed to allow an electrode insulating layer, e.g., a portion of the first gap-fill insulating layer 121, to remain on an inner sidewall of the hole 101. In addition, a pattern or a mask may be additionally formed to selectively expose the first gap-fill insulating layer 121. Furthermore, a misalignment of the pattern or mask may lead to a process failure in the formation of the electrode insulating layer. By contrast, according to the present embodiments, as will be described with reference to FIG. 2K, the through electrode 150 may be electrically isolated from the substrate 100 due to the presence of the gap 102, and thus, the additional processes for forming the electrode insulating layer or the pattern or mask may not be needed. That is, according to example embodiments of the inventive concepts, the first gap-fill insulating layer 121 may be easily formed in a self-aligned manner, without difficulties in the forming process, such as the selective removal of the first gap-fill insulating layer 121 and/or the misalignment of the pattern or mask.

Figure 2H:
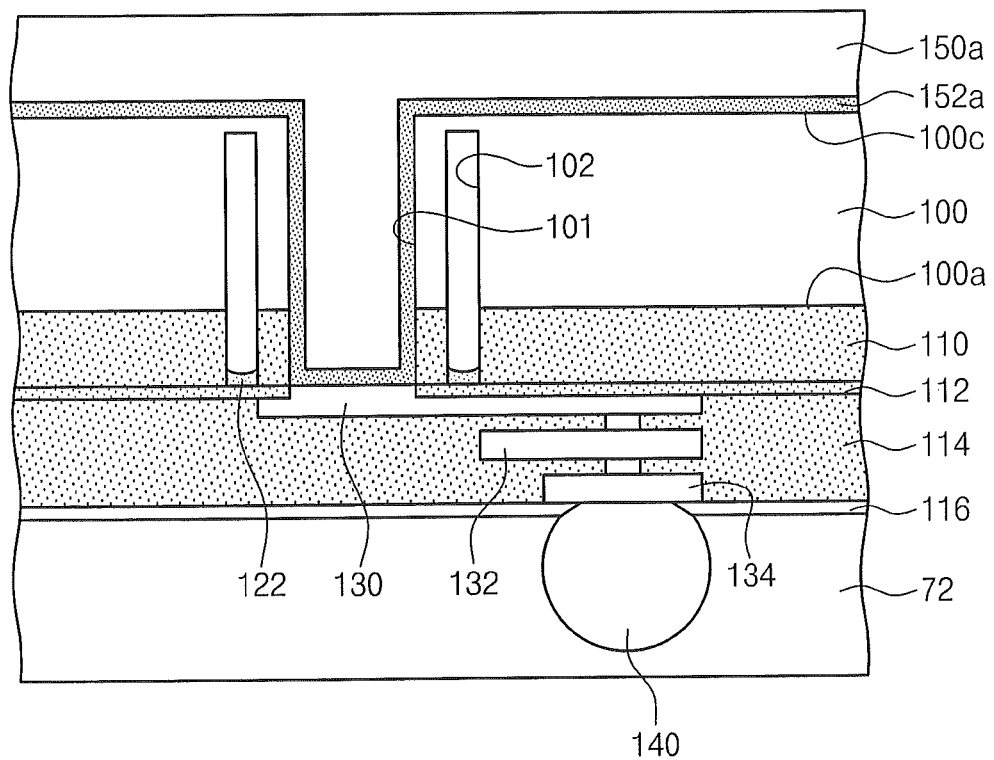
Figure 2I:
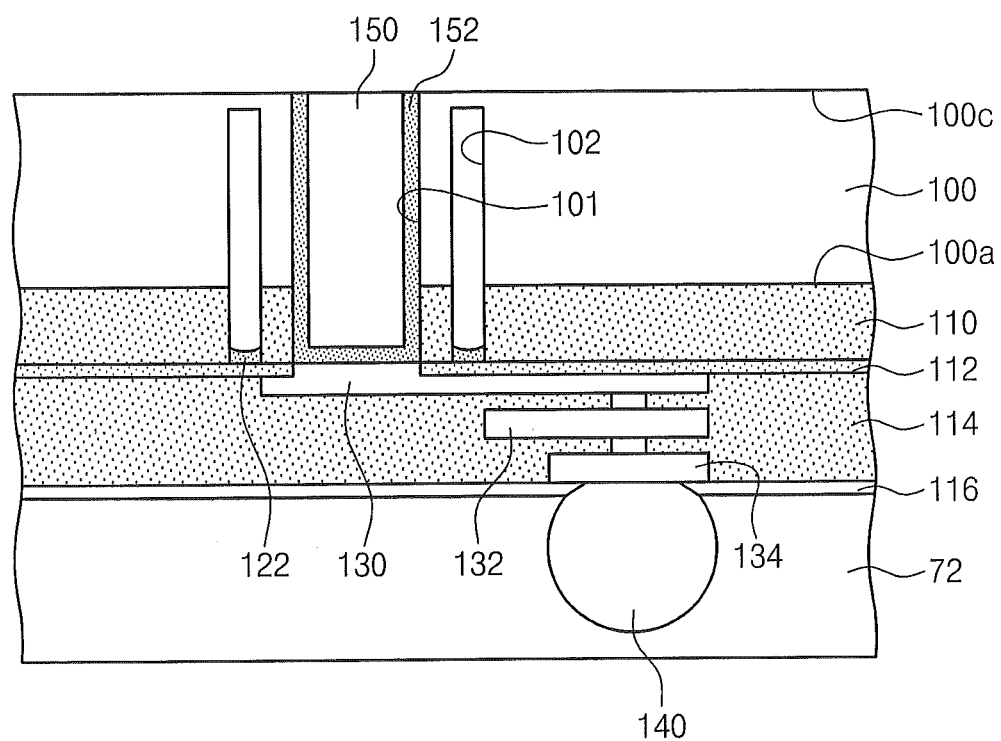

Referring to FIG. 2H, an electrode layer 150a may be formed on the second bottom surface 100c of the substrate 100 to have a thickness capable of filling the hole 101. Optionally, before the formation of the electrode layer 150a, a metal layer 152a may be additionally formed to conformally cover the inner wall of the hole 101. The metal layer 152a may extend from the inner wall of the hole 101 to the second bottom surface 100c of the substrate 100. The metal layer 152a may be formed to be in direct contact with the upper metal interconnection line 130 exposed by the hole 101. At least one of the electrode layer 150a and the metal layer 152a may be formed of a conductive material (e.g., of doped polysilicon, copper, tungsten, aluminum, platinum, gold, silver, iridium, titanium, tantalum, tin, chromium, nickel, or any combination thereof). For example, the electrode layer 150a may be formed of copper, and the metal layer 152a may be formed of a material, such as titanium nitride or tantalum nitride, that is capable of blocking the diffusion of copper atoms.

In some embodiments, the metal layer 152a may be formed of at least one metallic material, which is selected to easily form the electrode layer 150a, to make a mechanically robust joint between the electrode layer 150a and the upper metal interconnection line 130, and/or to prevent chemical elements constituting the electrode layer 150a from being diffused into the substrate 100 and/or interlayer dielectrics 110 and 114. For example, in the case in which the electrode layer 150a is formed by an electroplating method, the metal layer 152a may serve as a seed layer for forming the electrode layer 150a. In other embodiments, the metal layer 152a may serve as an adhesive layer capable of robustly joining the electrode layer 150a with the upper metal interconnection line 130. In still other embodiments, the metal layer 152a may serve as a diffusion barrier capable of preventing elements constituting the electrode layer 150a (e.g., copper) from being diffused into the substrate 100 and/or interlayer dielectrics 110 and 114.

Referring to FIG. 2I, the electrode layer 150a and the metal layer 152a may be planarized using at least one of an etching process, a CMP process, or a grinding process. The planarization may be performed to expose the second bottom surface 100c. As the result of the planarization, the metal layer 152a may remain on the inner wall of the hole 101, thereby forming a metal liner layer 152 shaped like a letter 'U'. Also, as the result of the planarization, the electrode layer 150a may be remained within the hole 101 to form the through electrode 150 penetrating the substrate 100 and the first interlayer dielectric 110. As shown, the through electrode 150 may be connected to the upper metal interconnection line 130. The metal liner layer 152 may be in direct contact with the substrate 100, and in this case, the through electrode 150 may be indirectly contacted to the substrate 100 via the metal liner layer 152. In other embodiments, the metal liner layer 152 may serve as a portion of the through electrode 150, and in this case, the through electrode 150 may be in direct contact with the substrate 100.

Figure 2J:
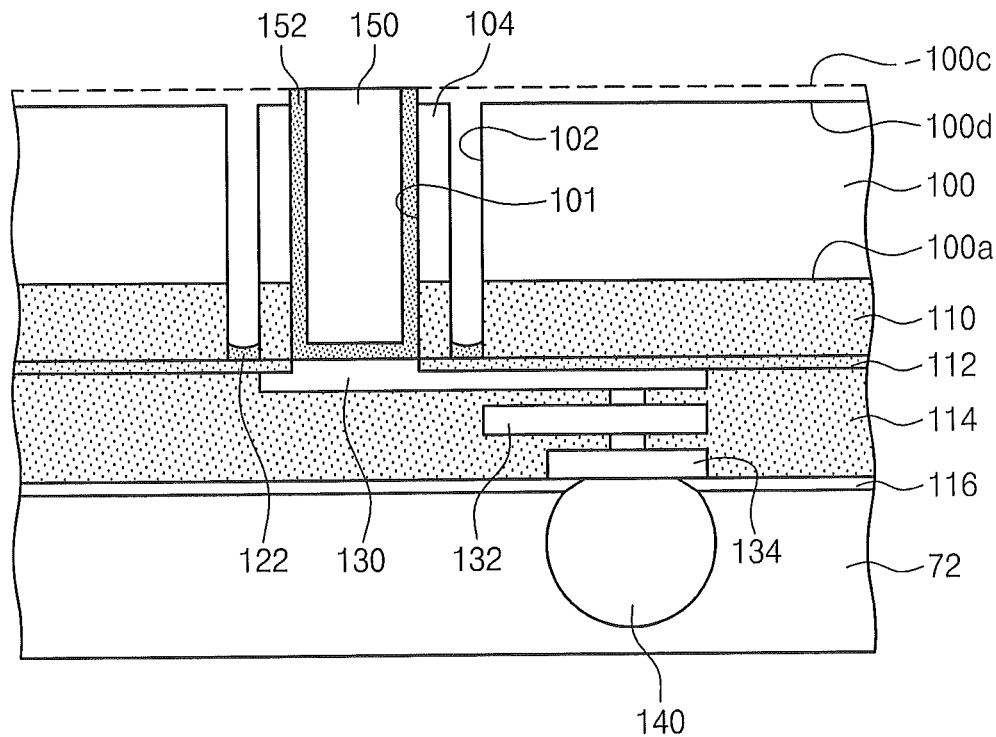

Referring to FIG. 2J, a second substrate-thinning process recessing the second bottom surface 100c of the substrate 100 may be performed to expose the gap 102. The second substrate-thinning process may be performed using at least one of an etching process, a CMP process, or a grinding process to partially remove the substrate 100 and delimit a third bottom surface 100d of the substrate 100. The third bottom surface 100d may be located at a level closer to the active surface 100a than the second bottom surface 100c. In some embodiments, the metal liner layer 152 and the through electrode 150 may protrude from the third bottom surface 100d. A portion of the substrate 100 located between the second and third bottom surfaces 100c and 100d may be removed during the second substrate-thinning process, such that a portion 104 (hereinafter, referred to as an "isolated portion) of the substrate 100 may be spatially spaced apart from the remaining portion of the substrate 100 by the gap 102. Hereinafter, the third bottom surface 100d may be referred to as an "inactive surface".

According to the present embodiments, two thinning processes of recessing the substrate 100 (i.e., the first and second substrate thinning processes described with reference to FIGS. 2F and 2J) may be performed to make the substrate 100 thin. In the two thinning processes of recessing the substrate 100, a recess depth of the first bottom surface 100b may be equal or similar to that of the second bottom surface 100c. Alternatively, the first bottom surface 100b may be recessed a first distance in the first substrate thinning process, while the second bottom surface 100c may be recessed a second distance that is less than the first distance in the second substrate thinning process. This may increase a degree of flatness of the inactive surface 100d.

Figure 2K:
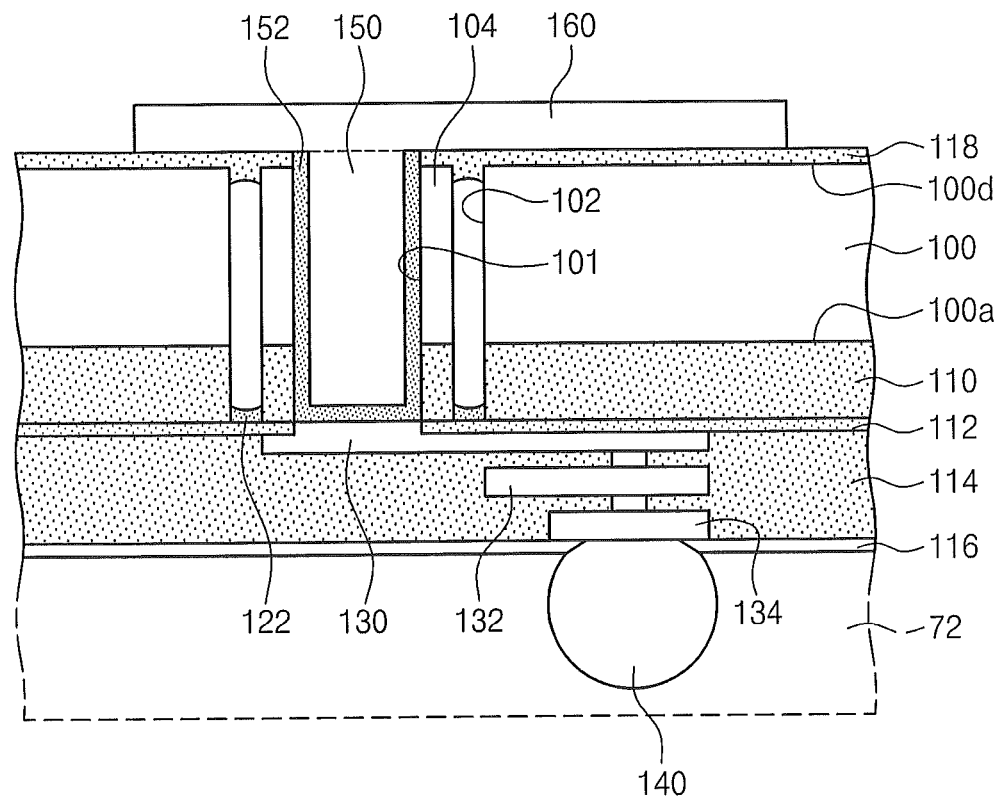

Referring to FIG. 2K, a lower insulating layer 118 may be formed to cover the inactive surface 100d of the substrate 100. The formation of the lower insulating layer 118 may include depositing a layer, which may be formed of at least one of silicon oxide, silicon nitride, silicon oxynitride, or polymer, using a chemical vapor deposition method. In some embodiments, the lower insulating layer 118 may be formed to fill incompletely or partially the gap 102, according to a process condition or a step coverage property of the CVD. For example, the gap 102 may be in the state of a vacuum or be filled with an air. As a result, the isolated portion 104 and the through electrode 150 may be electrically isolated from the remaining portion of the substrate 100, because the isolated portion 104 is spaced apart from the remaining portion of the substrate 100 by the gap 102 whose dielectric constant is substantially close to one. Optionally, a lower metal interconnection line 160 may be further formed on the inactive surface 100d of the substrate 100 and be connected to the through electrode 150. Thereafter, the supporting structure 72 may be selectively removed to form the semiconductor device 1 shown in FIG. 1A.

According to example embodiments of the inventive concepts, the through electrode 150 may be formed based on the via-last scheme (i.e., after the formation of the metal interconnection lines 130 and 132). This may prevent the through electrode 150 from expanding or being extruded over the first interlayer dielectric 110 as a result of a thermal stress accompanying the formation of the metal interconnection lines 130 and 132. Accordingly, although the hole 101 may be formed based on the via-middle scheme, it is possible to suppress a contact failure or an increase in contact resistance between the through electrode 150 and the upper metal interconnection line 130, which may result from the extrusion of the through electrode 150. Furthermore, the gap-fill insulating layer 121 filling the hole 101 may be removed, without an additional mask pattern, by using a substrate thinning process. This may prevent a misalignment associated with the additional mask pattern from occurring.

Fabricating Method

Example 2

FIGS. 3A through 3G are sectional views illustrating methods of fabricating a semiconductor device according to other example embodiments of inventive concepts. For the sake of brevity, the elements and features of these embodiments that are similar to those previously shown and described will not be described in much further detail.

Figure 3A:
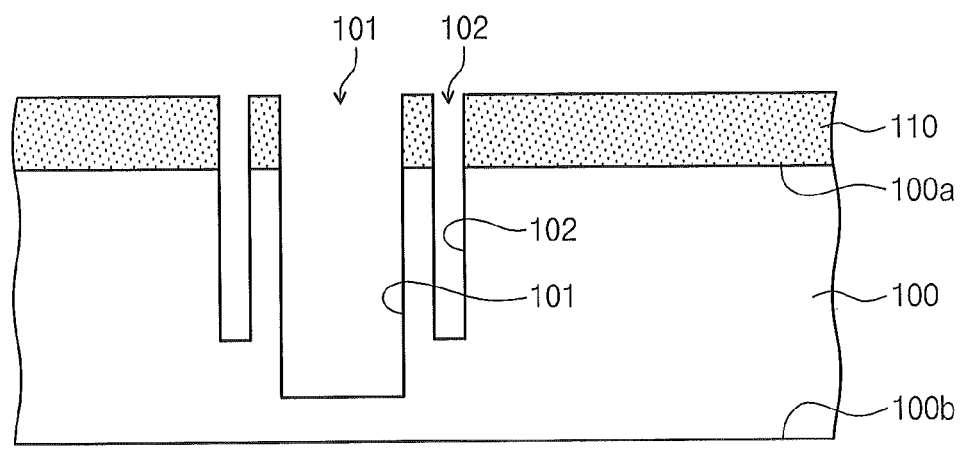
FIGS. 3A through 3G are sectional views illustrating a method of fabricating a semiconductor device according to other example embodiments of the inventive concepts.

Referring to FIG. 3A, the substrate 100 and the first interlayer dielectric 110 may be selectively removed to form the hole 101 and the gap 102 around the hole 101. The gap 102 may be formed to have a depth smaller than the hole 101 and a width equivalent to or similar to the hole 101. In other embodiments, the gap 102 may be formed to have a width smaller than the hole 101 and be filled with an insulating material to have a low aspect ratio.

Figure 3B:
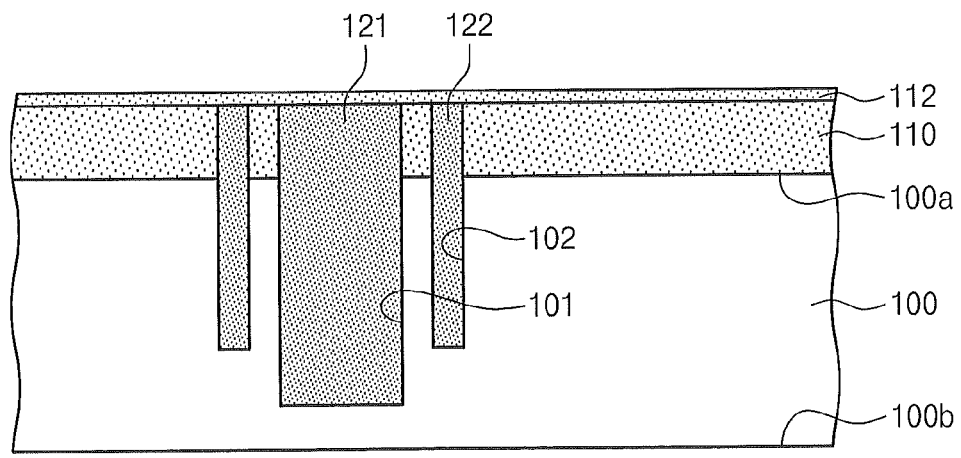

Referring to FIG. 3B, the first gap-fill insulating layer 121 may be formed to fill the hole 101, and the second gap-fill insulating layer 122 may be formed to fill the gap 102. For example, the formation of the first and second gap-fill insulating layers 121 and 122 may include depositing and planarizing an insulating material having an etch selectivity with respect to the substrate 100 and the first interlayer dielectric 110. The insulating material for the first and second gap-fill insulating layers 121 and 122 may be formed to have a thickness capable of filling the hole 101 and the gap 102. In some embodiments, the etch stop layer 112 may be further formed on the first interlayer dielectric 110.

Figure 3C:
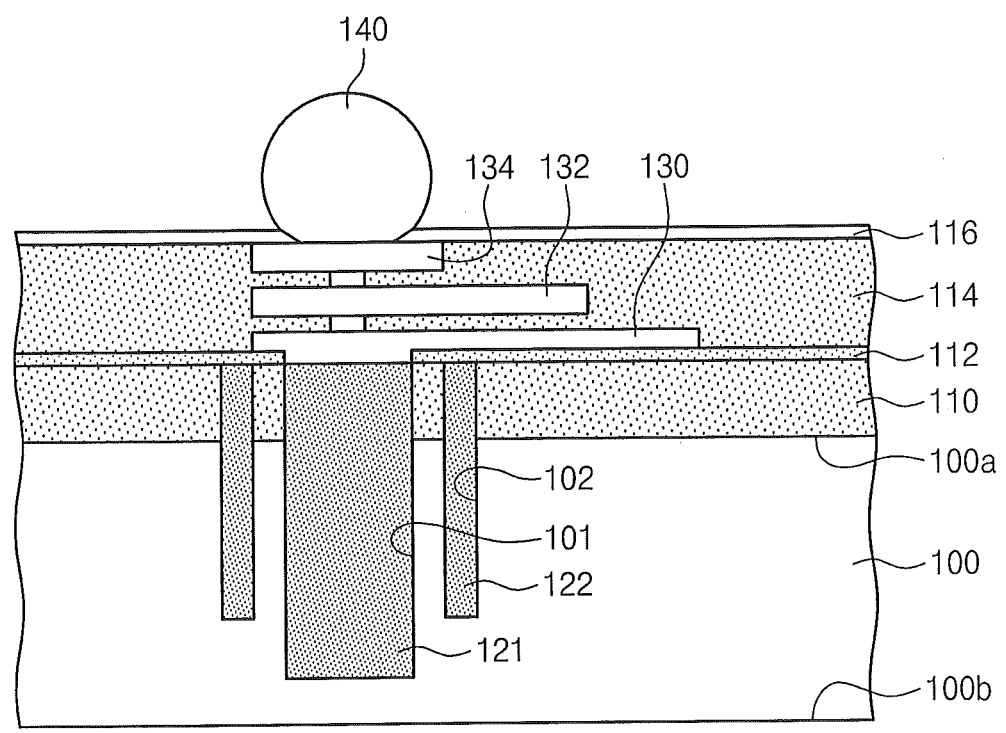

Referring to FIG. 3C, a back-end process may be performed to form the upper metal interconnection line 130, the second metal interconnection line 132, and the bonding pad 134. The second interlayer dielectric 114 may be formed on the first interlayer dielectric 110 to cover the upper metal interconnection line 130, the second metal interconnection line 132 and the bonding pad 134. The bump forming process may be performed to form the solder ball 140 attached to the bonding pad 134.

Figure 3D:
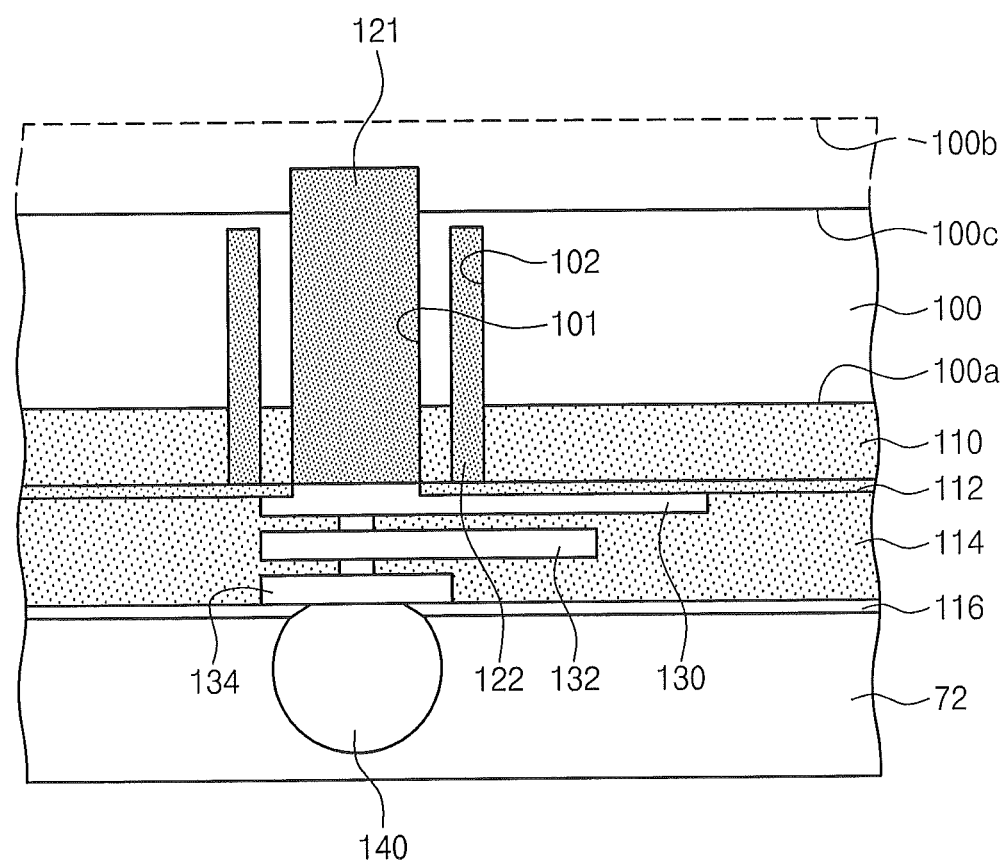

Referring to FIG. 3D, the first substrate thinning process recessing the first bottom surface 100b of the substrate 100 may be performed to define the second bottom surface 100c exposing or protruding the first gap-fill insulating layer 121 from the substrate 100. The second bottom surface 100c may be formed not to expose the gap 102. In some embodiments, before the recessing of the first bottom surface 100b, the first substrate-thinning process may further include attaching the supporting structure 72 to the substrate 100 and inverting the substrate 100 provided with the supporting structure 72.

Figure 3E:
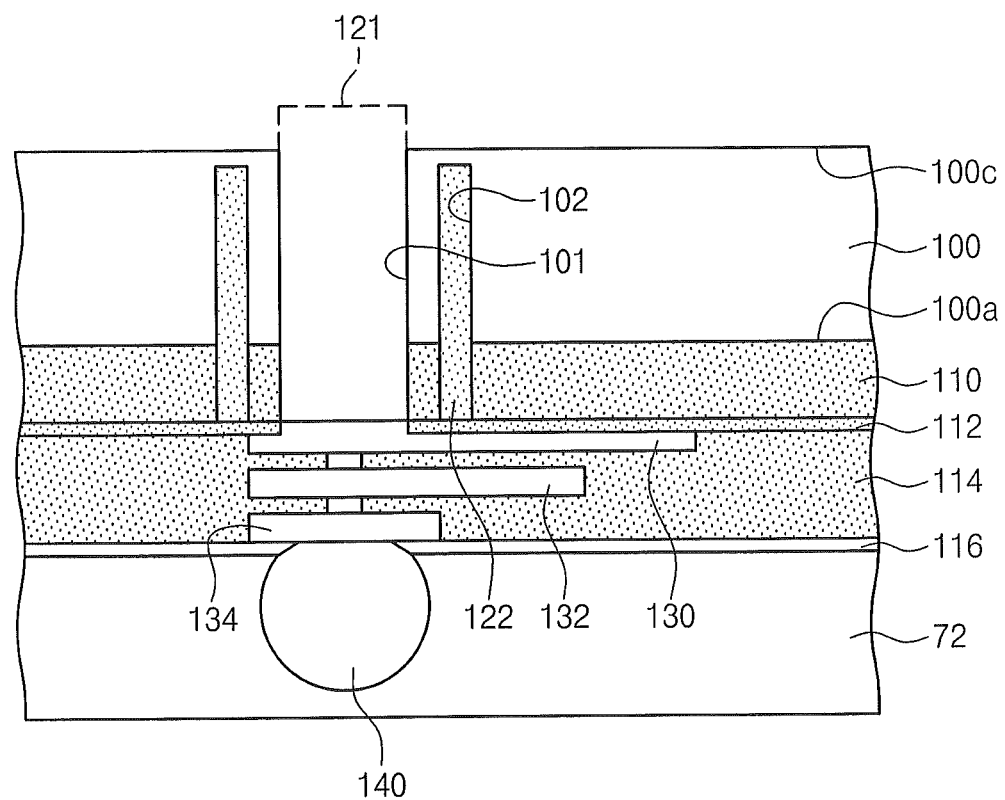

Referring to FIG. 3E, the first gap-fill insulating layer 121 may be removed to expose the upper metal interconnection line 130 through the hole 101. The removal of the first gap-fill insulating layer 121 may be performed without an additional mask pattern, in a self-alignment manner.

Figure 3F:
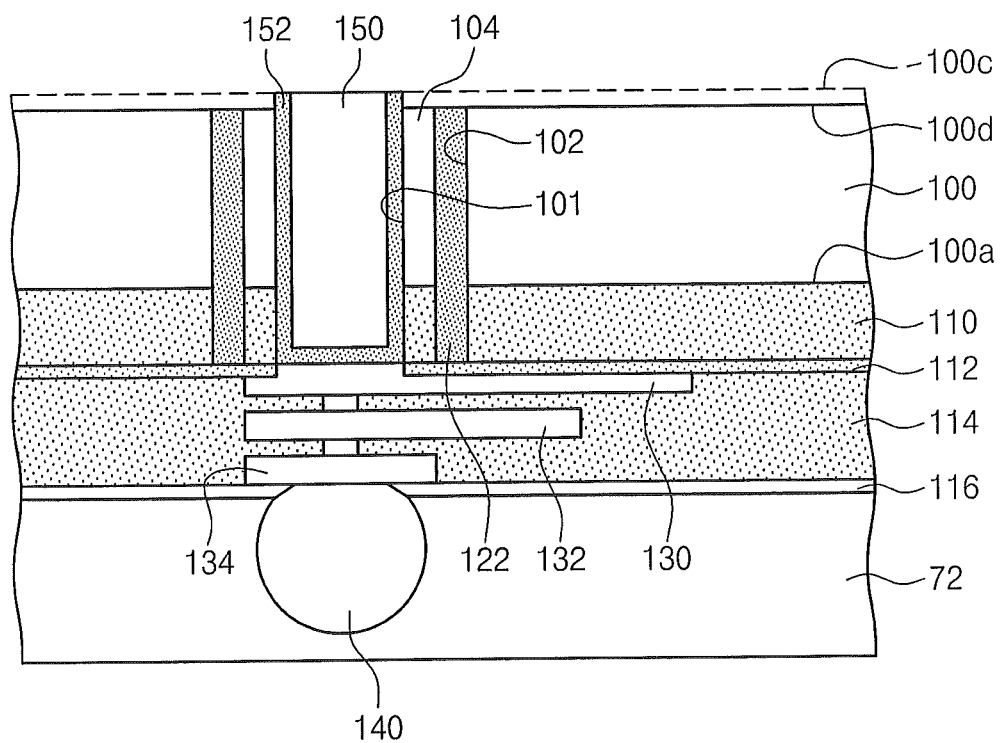

Referring to FIG. 3F, the through electrode 150 may be formed to fill the hole 101. The metal liner layer 152 may be further formed in the hole 101 to have a 'U' shape and be connected to the upper metal interconnection line 130. Thereafter, the second substrate thinning process recessing the second bottom surface 100c of the substrate 100 may be performed to define the third bottom surface 100d exposing the gap 102. As a result, the isolated portion 104 may be formed around the through electrode 150. The isolated portion 104 may be in contact with a side surface of the through electrode 150 and be spaced apart from the remaining portion of the substrate 100 by the gap 102 and/or the second gap-fill insulating layer 122 filling the gap 102.

Figure 3G:
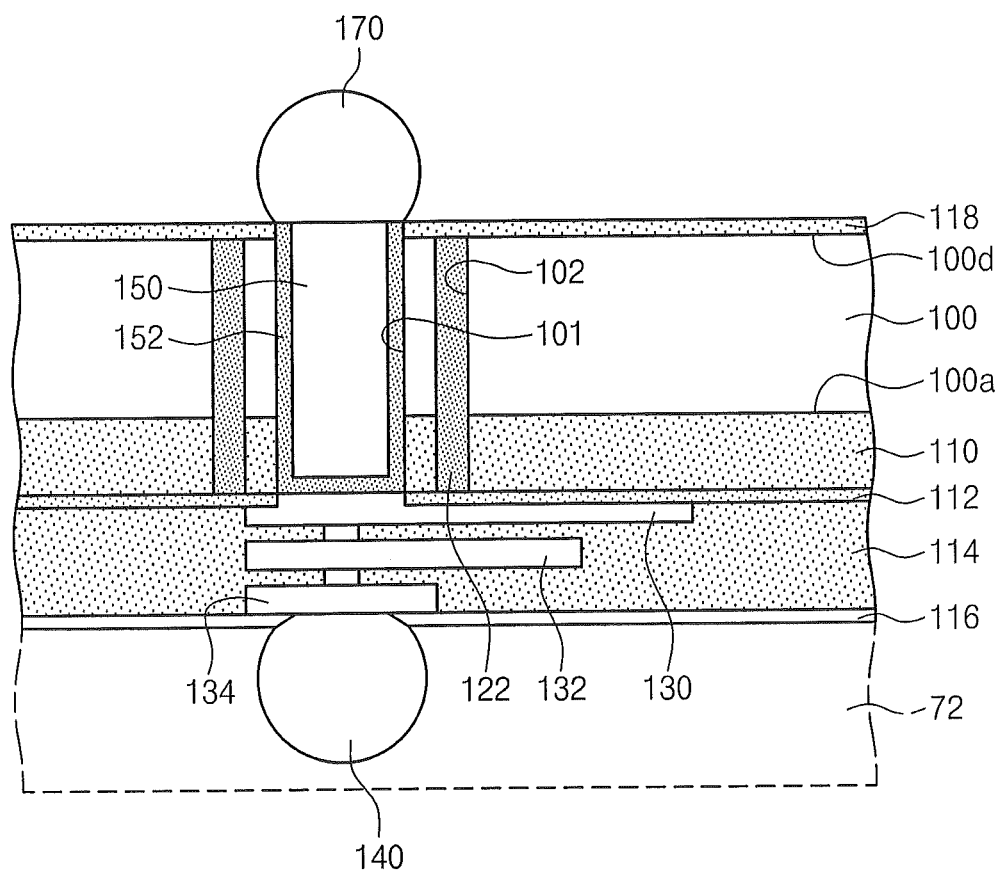

Referring to FIG. 3G, the lower insulating layer 118 may be formed to cover the third bottom surface or inactive surface 100d of the substrate 100. Since the gap 102 is filled with the second gap-fill insulating layer 122, the through electrode 150 may be electrically isolated from the substrate 100. Optionally, a solder ball 170 may be formed on the through electrode 150. Thereafter, the supporting structure 72 may be selectively removed to form the semiconductor device 2 shown in FIG. 1D.

Applications of Embodiments

Figure 4A:
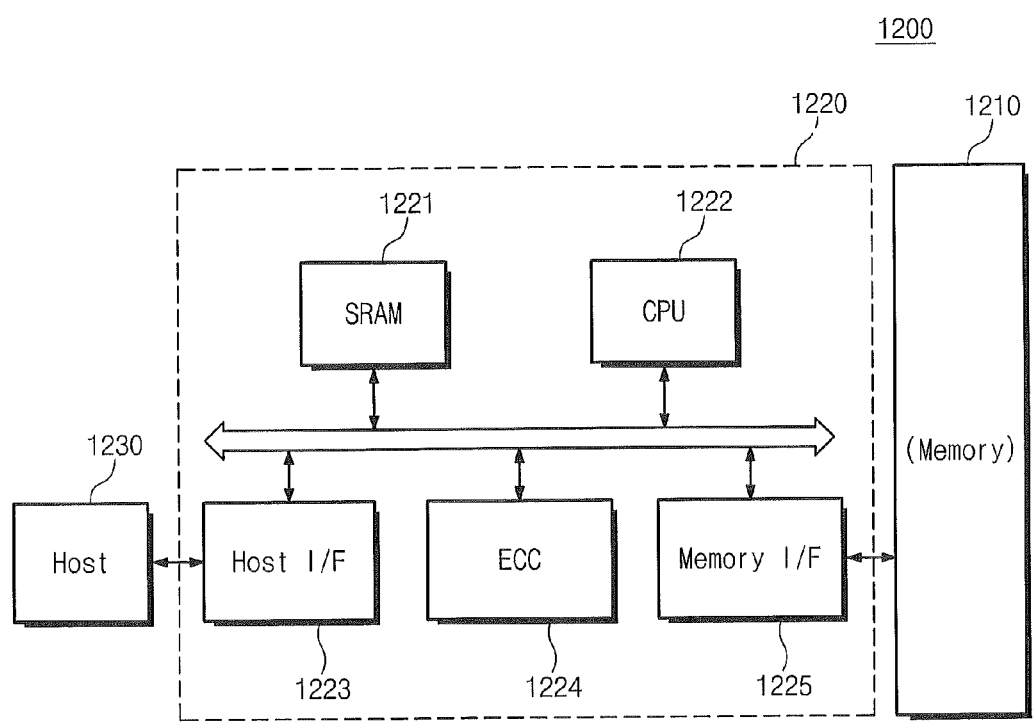
FIG. 4A is a block diagram of a memory card including a semiconductor device according to example embodiments of the inventive concepts.

FIG. 4A is a block diagram of a memory card including a semiconductor device according to example embodiments of the inventive concepts.

Referring to FIG. 4A, a memory card 1200 may include a memory controller 1220 controlling general data exchanges between a host and the memory device 1210. A static random access memory (SRAM) 1221 may be used as an operating memory of a processing unit 1222. A host interface 1223 may include a data exchange protocol of a host connected to a memory card 1200. An error correction block 1224 may detect and correct errors included in data read from a multi-bit memory device 1210. A memory interface 1225 may interface with the memory device 1210. A processing unit 1222 may perform general control operations for data exchange of the memory controller 1220. The memory card 1200 may be realized using a memory device 1210 including at least one of the semiconductor devices 1 and 2 and the semiconductor packages 10 and 20 according to example embodiments of the inventive concepts.

Figure 4B:
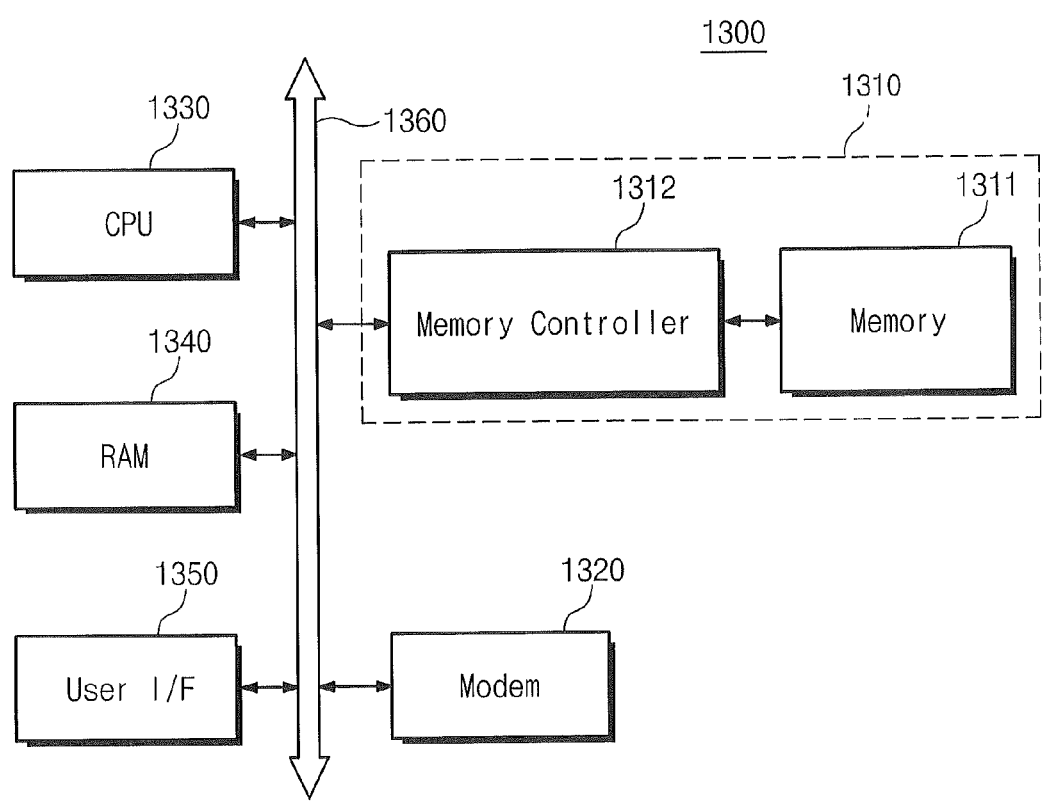
FIG. 4B is a block diagram of an information processing system including a semiconductor device according to example embodiments of the inventive concepts.

FIG. 4B is a block diagram of an information processing system including a semiconductor device according to example embodiments of the inventive concepts.

Referring to FIG. 4B, an information processing system 1300 may be realized using a memory system 1310 including at least one of the semiconductor devices 1 and 2 and the semiconductor packages 10 and 20 according to example embodiments of the inventive concepts. For instance, the information processing system 1300 may be a mobile device and/or a desktop computer. In some embodiments, the information processing system 1300 may further include a modem 1320, a central processing unit (CPU) 1330, a random access memory (RAM) 1340, and a user interface 1350, which are electrically connected to a system bus 1360, in addition to the memory system 1310. The memory system 1310 may include a memory device 1311 and a memory controller 1312. In some embodiments, the memory system 1310 may be configured substantially identical to the memory card 1200 described with respect to FIG. 4A. Data processed by the CPU 1330 and/or input from the outside may be stored in the memory system 1310. In some embodiments, the memory system 1310 may be used as a portion of a solid state drive (SSD), and in this case, the information processing system 1300 may stably and reliably store a large amount of data in the memory system 1310. Although not illustrated, it is apparent to those skilled in the art that, for example, an application chipset, a camera image sensor, a camera image signal processor (ISP), an input/output device, or the like may further be included in the information processing system 1300 according to the inventive concepts.

According to example embodiments of the inventive concepts, a hole to be filled with a through electrode may be formed in a via-middle scheme, and the through electrode may be formed in a via-last scheme. This may prevent the through electrode from being extruded by a thermal process or a thermal stress, and thus, it may be possible to reduce contact failures and/or increases in contact resistance between the through electrode and the metal interconnection line that may occur with conventional via-middle processes. As a result, electrical properties of the semiconductor device can be improved. Furthermore, an air gap may be provided to electrically isolate the through electrode from a substrate, and this may enable selective removal of an insulating material from the hole without an additional mask pattern. As a result, it is possible to prevent a misalignment associated with the additional mask pattern from occurring, to reduce the number of process steps, and to simplify a process of fabricating the semiconductor device.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
   a substrate having a top surface provided with an integrated circuit and a bottom surface facing the top surface;
   a through electrode penetrating the substrate and electrically connected to the integrated circuit;
   an isolating gap spaced apart from the through electrode and surrounding the through electrode; and
   a metal interconnection line on the top surface of the substrate and coupled to the through electrode,
   wherein the substrate comprises an isolated portion interposed between the isolating gap and the through electrode, the isolated portion being spatially and electrically spaced apart from a remaining portion of the substrate by the isolating gap.

2. The device of claim 1, wherein the through electrode comprises at least one of a conductive layer or a barrier metal layer, and
   the conductive layer fills a hole penetrating the substrate and the barrier metal layer is provided between the conductive layer and the metal interconnection line and between the conductive layer and the isolated portion.

3. The device of claim 2, wherein the through electrode includes copper and the barrier metal layer includes titanium nitride or tantalum nitride preventing the copper from being diffused.

4. The device of claim 1, further comprising an insulating layer at least partially filling the isolating gap.

5. The device of claim 1, wherein the isolating gap is ring-shaped.

6. The device of claim 2, wherein the hole has a first width and the isolation gap has a second width smaller than the first width.

7. The semiconductor device of claim 1, further comprising:
   a first interlayer dielectric layer on the top surface of the substrate to cover the integrated circuit, the metal interconnection line being disposed on the first interlayer dielectric layer; and
   a second interlayer dielectric layer on the first interlayer dielectric layer to cover the metal interconnection line,
   wherein the through electrode further penetrates the first interlayer dielectric layer.

8. The device of claim 7, wherein the isolating gap penetrates the substrate and the first interlayer dielectric layer.

9. The device of claim 7, further comprising a lower insulating layer on the bottom surface of the substrate,
   wherein the isolating gap includes an internal space whose top and bottom entrances are sealed by the first interlayer dielectric layer and the lower insulating layer, respectively.

10. The device of claim 9, wherein the internal space comprises a vacuum or is filled with an air.

11. The device of claim 9, wherein the internal space is partially or wholly filled with a gap-filling insulating layer.

* * * * *